(12) United States Patent
Perrott

(10) Patent No.: US 9,705,514 B2
(45) Date of Patent: Jul. 11, 2017

(54) HYBRID ANALOG AND DIGITAL CONTROL OF OSCILLATOR FREQUENCY

(71) Applicant: Silicon Laboratories Inc., Austin, TX (US)

(72) Inventor: Michael H. Perrott, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 389 days.

(21) Appl. No.: 14/554,798

(22) Filed: Nov. 26, 2014

(65) Prior Publication Data

US 2015/0145566 A1    May 28, 2015

Related U.S. Application Data

(60) Provisional application No. 61/909,486, filed on Nov. 27, 2013.

(51) Int. Cl.
| | |
|---|---|
| *H03L 7/06* | (2006.01) |
| *H03L 7/099* | (2006.01) |
| *H03L 7/08* | (2006.01) |
| *H03L 7/093* | (2006.01) |

(52) U.S. Cl.
CPC .......... *H03L 7/0991* (2013.01); *H03L 7/0802* (2013.01); *H03L 7/093* (2013.01); *H03L 7/0994* (2013.01)

(58) Field of Classification Search
USPC .................................. 327/147–149, 156–158
See application file for complete search history.

(56) References Cited

U.S. PATENT DOCUMENTS

2005/0226357 A1* 10/2005 Yoshimura ................ H03L 7/10
                                                        375/376
2006/0056561 A1*  3/2006 Zhang ..................... H03L 7/087
                                                        375/376

(Continued)

OTHER PUBLICATIONS

Hsu, C. et al., "A Low-Noise Wide-BW 3.6-GHz Digital ΔΣ Fractional-N Frequency Synthesizer With a Noise-Shaping Time-to-Digital Converter and Quantization Noise Cancellation," IEEE Journal of Solid-State Circuits, vol. 43, No. 12, Dec. 2008, pp. 2776-2786.

(Continued)

*Primary Examiner* — Adam Houston
(74) *Attorney, Agent, or Firm* — Zagorin Cave LLP

(57) ABSTRACT

A hybrid analog/digital control approach for a digitally controlled oscillator augments a digital control path with an analog control path that acts to center the digital control path control signal within its range. The digital control path controls a first group of varactors within an oscillator tank circuit using a digital filter and a delta sigma modulator, which generates a dithered control signal for at least one of the first group of varactors. The analog control path controls a second group of varactors in the tank circuit but actively tunes only one varactor at a time. The analog control path performs relatively low bandwidth centering of the digital control signal resulting in negligible impact on PLL bandwidth, stability, and noise performance. Instead, the digital control path dominates in setting the PLL dynamic and noise behavior, and has reduced range requirements due to the centering action.

20 Claims, 13 Drawing Sheets

(56) References Cited

U.S. PATENT DOCUMENTS

| | | | | |
|---|---|---|---|---|
| 2008/0315928 A1* | 12/2008 | Waheed | ............... | G04F 10/005 327/159 |
| 2010/0090731 A1* | 4/2010 | Casagrande | ......... | H03C 3/0925 327/148 |
| 2011/0215848 A1* | 9/2011 | Koroglu | ................... | H03L 7/06 327/157 |
| 2011/0316595 A1* | 12/2011 | Bolton | ................... | H03L 1/022 327/156 |
| 2012/0074993 A1* | 3/2012 | Chen | ....................... | H03L 1/00 327/147 |
| 2013/0257494 A1* | 10/2013 | Nikaeen | ............... | H03M 3/458 327/156 |
| 2014/0091864 A1* | 4/2014 | Wang | ..................... | H03L 7/099 331/16 |

OTHER PUBLICATIONS

Perrott, M. et al., "A 2.5-Gb/s Multi-Rate 0.25-μm CMOS Clock and Data Recovery Circuit Utilizing a Hybrid Analog/Digital Loop Filter and All-Digital Referenceless Frequency Acquisition," IEEE Journal of Solid-State Circuits, vol. 41, No. 12, Dec. 2006, pp. 2930-2944.

Staszewski, R. et al., "All-Digital TX Frequency Synthesizer and Discrete-Time Receiver for Bluetooth Radio in 130-nm CMOS," IEEE Journal of Solid-State Circuits, vol. 39, No. 12, Dec. 2004, pp. 2278-2291.

* cited by examiner

HYBRID ANALOG AND DIGITAL CONTROL OF OSCILLATOR FREQUENCY

CROSS-REFERENCE TO RELATED APPLICATION(S)

This application claims benefit under 35 U.S.C. §119(e) of provisional application 61/909,486 filed Nov. 27, 2013, entitled "HYBRID ANALOG AND DIGITAL IMPLEMENTATION FOR ACHIEVING DIGITAL CONTROL OF OSCILLATOR FREQUENCY", naming Michael H. Perrott as inventor, which application is incorporated herein by reference. This application also relates to U.S. patent application Ser. No. 14/448,447, filed Jul. 31, 2014, entitled "Cancellation of Delta-Sigma Quantization Noise Within a Fractional-N PLL With a Nonlinear Time-To-Digital Converter", U.S. patent application Ser. No. 14/448,458, filed Jul. 31, 2014, entitled "Cancellation of Spurious Tones Within a Phase Locked Loop with a Time-to-Digital Converter", U.S. patent application Ser. No. 14/448,466, filed Jul. 31, 2014, entitled "Time-to-Voltage Converter Using a Capacitor Based Digital to Analog Converter for Quantization Noise Cancellation", and U.S. patent application Ser. No. 14/448,482, filed Jul. 31, 2014, entitled "Time-to-Digital Converter Based on a Voltage Controlled Oscillator", which applications are incorporated herein by reference.

BACKGROUND

Field of the Invention

This invention relates to phase-locked loops and more particularly to control of phase-locked loops.

Description of the Related Art

Digital phase-locked loops (PLLs) require digital control of an oscillator. Several approaches to achieving such digital control are described in R. B. Staszewski, et. al., "All-Digital TX Frequency Synthesizer and Discrete-Time Receiver for Bluetooth Radio in 130-nm CMOS", JSSC, Volume 39, No 12, December 2004 pp. 2278-2291; C.-M. Hsu, M. Z. Straayer, M. H. Perrott, "A Low-Noise Wide-BW 3.6-GHz Digital Delta-Sigma Fractional-N Frequency Synthesizer With a Noise-Shaping Time-to-Digital Converter and Quantization Noise Cancellation," IEEE J. Solid-State Circuits, vol. 43, December 2008, pp. 2776-2786; and M. H. Perrott, Y. Huang, R. T. Baird, B. W. Garlepp, D. Pastorello, E. T. King, Q. Yu, D. B. Kasha, P. Steiner, L. Zhang, J. Hein, B. Del Signore, "A 2.5 Gb/s Multi-Rate 0.25 µm CMOS Clock and Data Recovery Circuit Utilizing a Hybrid Analog/Digital Loop Filter and All-Digital Referenceless Frequency Acquisition," IEEE J. Solid-State Circuits, vol. 41, December 2006, pp. 2930-2944.

In Hsu, a Digital-to-Analog Converter (DAC) is used to control an analog varactor, with segmentation into coarse and fine sections being employed to reduce design complexity while achieving excellent noise performance. However, that approach requires a relatively high resolution, low noise DAC implementation to prevent degradation of the oscillator's phase noise due to the large gain, defined as $K_v$, of the voltage-to-frequency characteristic occurring with such varactor tuning. A related approach is shown in Perrott, in which the use of a DAC for frequency control is complemented with a purely analog control path and an expander circuit that improves the linearity of the oscillator frequency control. The purely analog control path sets the overall PLL bandwidth, and allows the DAC-controlled path to have much lower bandwidth to allow for an easier DAC implementation and improved filtering of noise. However, this approach ends up being fairly complex from an analog implementation standpoint, and can lead to increased power and area requirements when excellent noise performance is required. In Staszewski, analog control of varactor(s) is avoided by instead dithering the varactor control voltage between high and low values. That approach avoids the need for a DAC, but requires small varactor sizes in order to prevent the quantization noise produced by dithering from degrading the oscillator's phase noise. In turn, the small varactor size requires a large number of varactors be employed to achieve a reasonably wide frequency tuning range for the oscillator. As such, an important concern in this all-digital approach is managing the complexity of the switch network that controls the high/low settings of each of the many varactors.

Accordingly, improvements in oscillator control are desirable.

SUMMARY OF EMBODIMENTS OF THE INVENTION

In one embodiment a phase-locked loop includes a digital control path to control a first plurality of varactors within a tank circuit of an oscillator and an analog control path to control a second plurality of varactors within the tank circuit to achieve wide range and high resolution (low noise) frequency control of the oscillator.

In another embodiment a method of operating a phase-locked loop includes controlling a first plurality of varactors within a tank circuit of an oscillator of the phased-lock loop using a digital control path and controlling a second plurality of varactors within the tank circuit using an analog control path to achieve frequency control of the oscillator using the first and second plurality of varactors.

In another embodiment a phase-locked loop includes a digital control path to control a first plurality of varactors within a tank circuit of an oscillator. The digital control path includes a digital filter and a delta sigma modulator coupled to the digital filter, the delta sigma modulator coupled to supply a dithered control signal for at least one varactor of the first plurality of varactors. The digital filter may include an accumulator and feedforward path. An analog control path controls a second plurality of varactors within the tank circuit. The analog control path is coupled to receive the digital filter output for use in generating analog control signals for the second plurality of varactors.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

In contrast to the prior approaches discussed above, a hybrid analog/digital implementation approach achieves digital control of the oscillator that provides excellent noise, wide PLL bandwidth, and reduced implementation complexity. The hybrid analog/digital approach augments a digital control path, which employs dithering of capacitors, with an analog control path that acts to center the digital control path signal. One benefit of performing steady-state centering is that the number of capacitors required in the digital control path is significantly reduced since the digital control path need only accommodate the impact of perturbations that are too fast to be accommodated by the analog control path. Also, such centering leads to better behaved noise shaping of the quantization noise spectrum produced by the $\Delta$-$\Sigma$ capacitor dithering process. In one embodiment, the analog control path uses multiple varactors but only one varactor is actively tuned at a given time. Having only one varactor actively tuned at a given time avoids the analog complexity, as well as the power and area consumption, required to implement an expander circuit. Since the analog control path only performs relatively low bandwidth centering of the digital control signal, any nonlinear behavior that the analog control path exhibits has negligible impact on the PLL bandwidth, stability, and noise performance. Instead, the digital control path dominates in setting the PLL dynamic and noise behavior. Overall, the proposed hybrid digital and nonlinear analog control approach offers excellent digital PLL performance with a relatively simple implementation.

Figure 1:
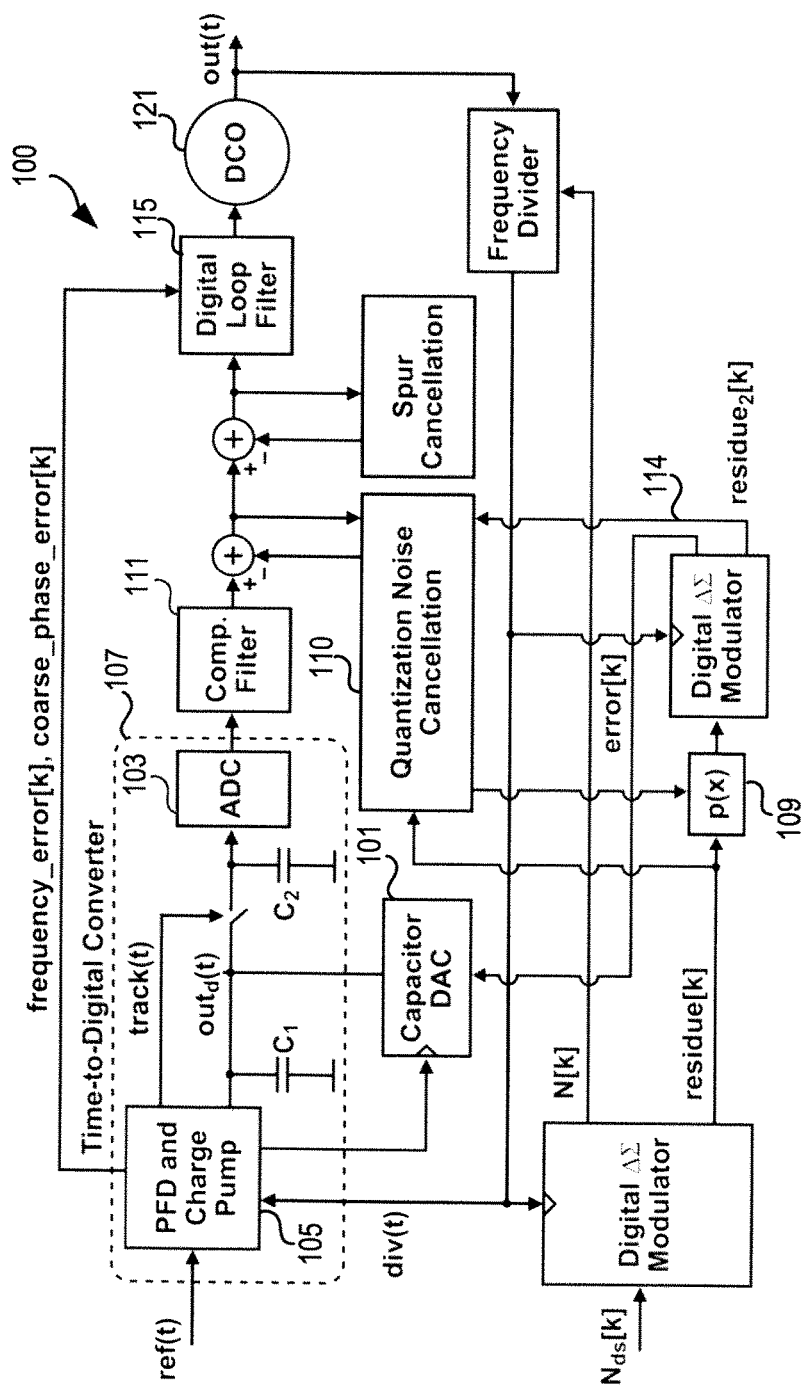
FIG. 1 is a block diagram of proposed quantization noise cancelling digital fractional-N PLL with capacitor DAC and digital quantization noise and spur cancellation.

The context of the techniques described herein is to realize a digitally controlled oscillator (DCO) in order to implement a high performance digital PLL. FIG. 1 illustrates a block diagram of an exemplary PLL that may utilize the hybrid control approach described herein. The embodiment of FIG. 1 is a quantization noise cancelling digital fractional-N digital PLL 100 with a capacitor DAC 101, digital nonlinear quantization noise cancellation, and spur cancellation. A high resolution Analog-to-Digital Converter (ADC) 103 digitizes the phase (or time) error signal produced by the PFD/Charge Pump circuits 105. Here the PFD/Charge Pump 105 can be considered as a Time-to-Voltage Converter (TVC) and the combined TVC and ADC 103 can be considered as a Time-to-Digital Converter (TDC) 107. The noise cancellation estimator 110 is implemented in a digital manner. Rather than constraining the cancellation to a linear approach, the digital estimator calculates the coefficients of a polynomial p(x) 109 that allows cancellation of the impact of nonlinearity in the TDC circuit 107. A digital compensation filter (Comp. Filter) 111 helps undo the effects of the filtering operation created by switching capacitor $C_1$ onto capacitor $C_2$. The use of the capacitor DAC 101 lowers the steady-state range required of the ADC 103 since the variation due to quantization noise is reduced, which also reduces the impact of nonlinearity in the ADC 103. In addition to the analog cancellation offered by the capacitor DAC 101, digital cancellation is also utilized after the ADC to further reduce noise. In particular, the residual error of the capacitor DAC cancellation is computed as $residue_2[k]$ 114, scaled appropriately, and then subtracted from the phase error signal before it is input to the digital PLL loop filter 115. The use of post ADC cancellation allows the capacitor DAC 101 to have lower resolution. While FIG. 1 illustrates one embodiment that may utilize the hybrid approach described herein, other PLLs may also take advantage of the hybrid control approach. Additional details on the embodiment of FIG. 1 can be found in applications incorporated by reference above.

In the embodiment of FIG. 1, the phase (or time) error of the PLL is digitized, which allows for sophisticated digital signal processing such as nonlinear quantization noise cancellation and spur cancellation. The digital loop filter 115 contains a digital filter that may include an accumulator and feed forward path to realize a type II or higher PLL, and the output of the loop filter 115 controls the DCO.

Figure 2:
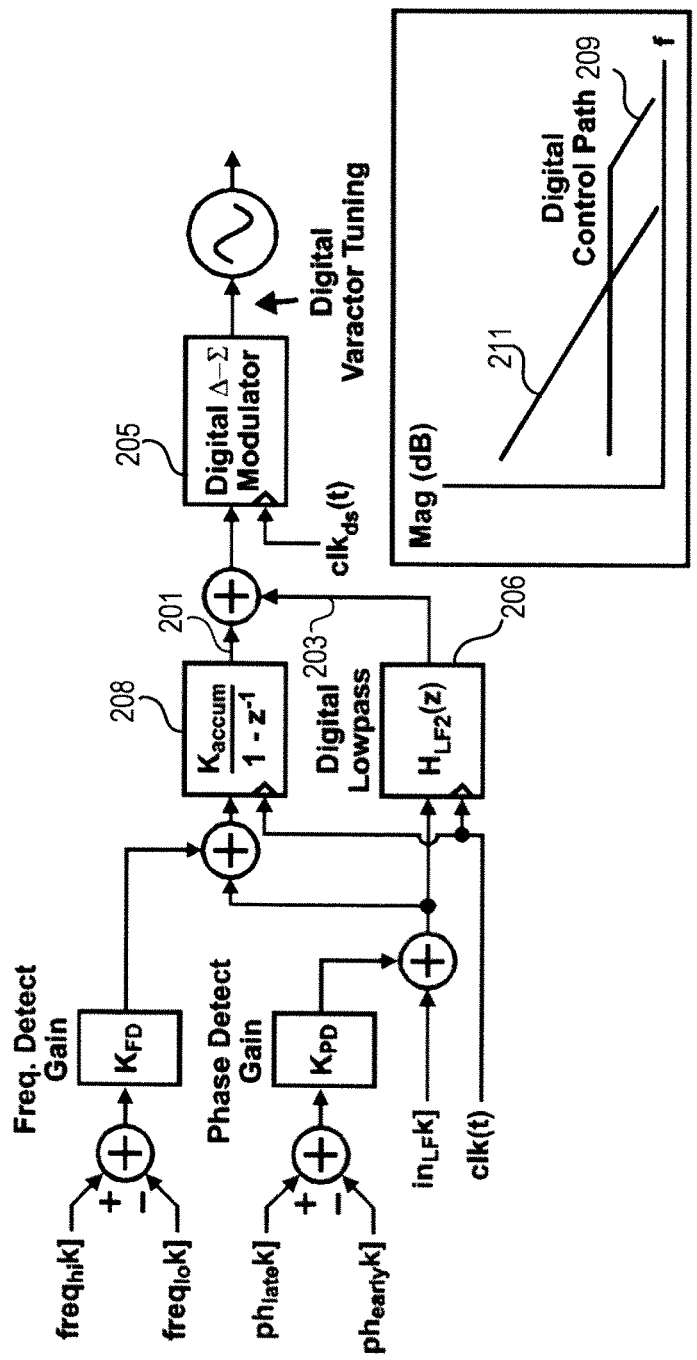
FIG. 2 illustrates a block diagram for classical all-digital control of an oscillator.

As a first step in explaining the proposed approach, FIG. 2 shows the traditional approach of achieving a digital control path for a loop filter of the oscillator, which is to send the combined accumulator path output signal 201 and the feedforward path output signal 203 into a $\Delta$-$\Sigma$ modulator 205 that is used to dither the appropriate varactor control signals within a bank of varactors. Since the dithering behavior of the Δ-Σ modulator generates quantization noise, the unit capacitor size has to be set sufficiently small to avoid having this noise impact the overall phase noise performance of the PLL. FIG. 2 illustrates the frequency response 209 of the digital lowpass filter 206 (i.e, feedforward path) and the frequency response 211 of the accumulator 208. However, to accommodate the desired frequency range of the PLL in the presence of Process, Temperature, and Voltage (PVT) variations, a large number of varactors are required, which leads to a complex control implementation (such as a large switch matrix) for setting each varactor control signal.

Figure 3:
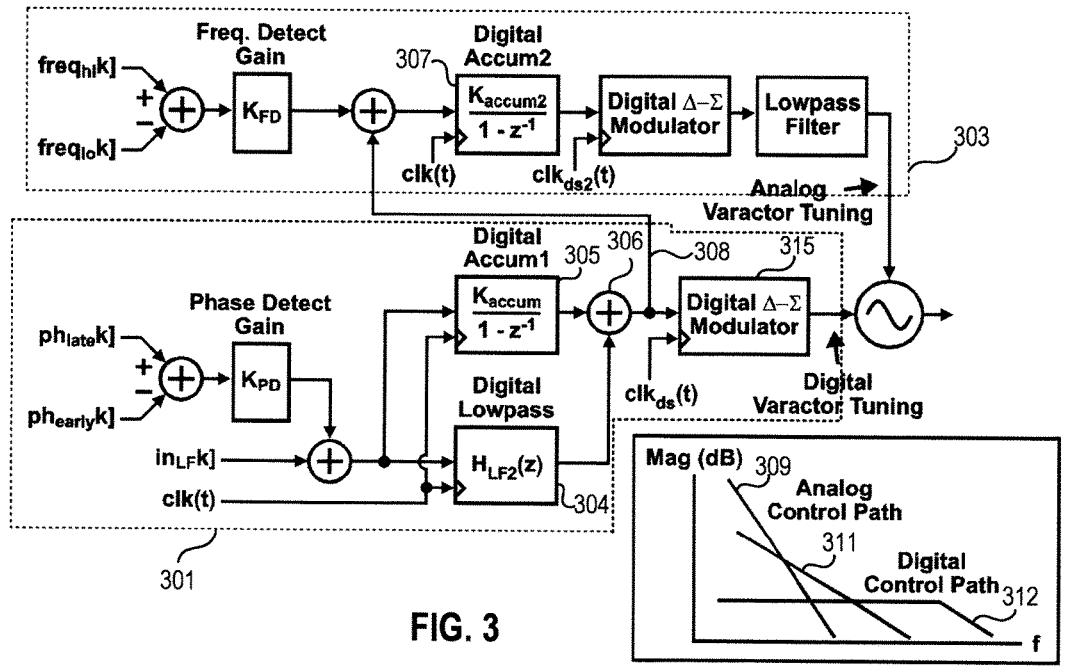
FIG. 3 illustrates an embodiment of hybrid analog/digital control of an oscillator in which the digital control path is augmented with a low frequency analog control path that acts to center the steady-state value of the digital control path signal.

The hybrid oscillator control approach described herein augments the digital control path 301 with an analog control path 303 as depicted in the embodiment of FIG. 3. Thus, in an embodiment, the loop filter 115 (FIG. 1) includes portions of both digital control path 301 and analog control path 303. Note that the delta-sigma modulators in the digital and analog control paths and the low pass filter in the analog control path may be considered to be part of DCO 121 (FIG. 1). A key aspect of this design is to set the frequency response of the analog control path sufficiently low such that it has a non-dominant effect on the PLL bandwidth and stability performance. In general, this is achieved by ensuring that the frequency response of the analog tuning path (which adds an additional accumulator path frequency response as seen by the cascade of Accum1 305 and Accum2 307) intersects the digital path frequency response at a frequency lower than the zero contained in the digital path response as shown in FIG. 3. Under this constraint, the digital control path effectively sets the PLL bandwidth and noise performance, with the analog control path simply acting to center the steady-state average of the digital control path. Thus, in the embodiment shown in FIG. 3, the analog control path 303 acts to center the steady state average of the signal 308 at the output of summer 306. FIG. 3 also illustrates the frequency response 309 of the analog control path 303 as well as the frequency response 311 and 312 of the digital control path 301.

Note that the digital control path 301 of the loop filter includes low pass filter 304 (feedforward path) and accumulator 305 (accumulator path), as shown in FIG. 3. A digital filter with the feedforward path and accumulator path within digital control path 301 may also be referred to as a lead-lag filter. However, in other embodiments, the digital filter in the digital path may be implemented in different ways. For example, higher order poles may be included in the digital filter. The particular digital filter implementation depends on the requirements of the particular system based on the desired frequency response of the filter, which depends on the requirements of the particular system. For example, the accumulator in the digital control path aids in suppressing low frequency phase noise of the DCO, but generally increases settling time. As such, in some applications it may be preferable to avoid the accumulator in order to improve settling time despite the increased impact of low frequency phase noise of the DCO. However, due to the accumulator in the analog path, the worse case settling time improvement may be modest. The centering action of the analog control path significantly reduces the required range of the digital control path since it needs only counter the impact of perturbations that are too fast to be accommodated by the analog control path. The analog control path provides the much larger range required to achieve the desired oscillator frequency range under PVT variations. The reduced range of the digital control path implies a reduced number of capacitors that it must control. Also, the centering action yields better behaved noise spectral properties for the digital control path dithering operation since the nominal value of the Δ-Σ modulator 315 is set to a mid-range value. Note that although the final control signaling for the varactors in the analog control path is analog, much of the control circuitry in the analog control path is digital.

The approach described herein allows a nonlinear analog control path to be utilized, as explained further herein, while still maintaining consistent dynamic and noise performance for the PLL. Note that the accumulator of the analog path is in parallel with an effective feedforward path coming from the digital control path. As such, the analog path accumulator forms an analog-influenced zero at the point of intersection in the transfer function of the analog path and the effective feedforward path coming from the digital control path. For stability, that analog-influenced zero needs to be placed low in frequency—less than one third that of the PLL bandwidth for a practical implementation. In addition, as suggested above, a preferred approach is to set the analog-influenced zero below that of the digitally-set zero formed by the accumulator and feedforward path in the digital control path so that the digital control path has a dominant influence on the PLL dynamics.

Digital Control Path Implementation

Figure 4:
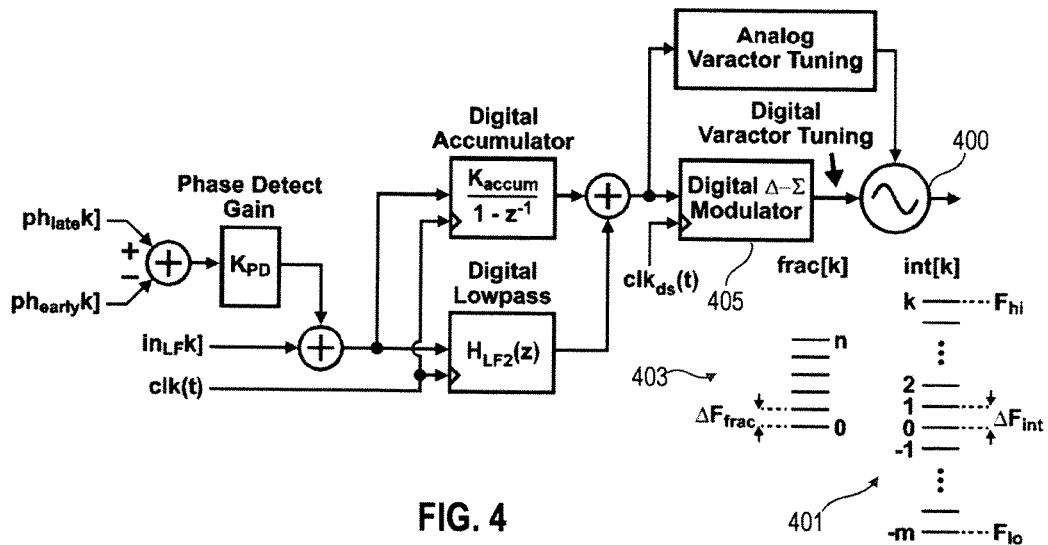
FIG. 4 illustrates segmentation of digital control path varactors into fractional and integer sections, where only the fractional varactors are dithered by the Δ-Σ modulator, and the integer varactors extend the frequency control range beyond that provided by the fractional capacitors.

While the frequency range required of the digital control path is significantly reduced by inclusion of the analog control path, it is still worthwhile to consider efficient implementation of its varactor bank control circuitry. The oscillator 400 is formed of a tank circuit with an inductance (not shown) and a combination of integer varactors 401 and fractional varactors 403 as shown in FIG. 4, each of which has a binary control signal that chooses either a high or low capacitance value for a given varactor. The integer varactors 401 are not controlled by Δ-Σ dithering during steady-state operation and change their value only during large PLL transients (such as initial phase locking). As such, noise induced by switching the integer varactors is not of significant concern, which significantly eases the implementation of their respective switch network. The fractional varactors are dithered according to a Δ-Σ modulator 405 and are active during steady-state operation of the PLL. In general, multiple fractional varactors may be required in order to achieve a sufficiently wide frequency tuning range and sufficiently low dithering noise so as to not impact the PLL phase noise performance. In such case, a multi-bit, first order Δ-Σ modulator is generally the preferred means of providing dithering of the fractional varactors, though a higher order Δ-Σ modulator could be considered for some applications. Note that the clock signal for the Δ-Σ modulator, $clk_{ds}(t)$, should generally be derived from the oscillator output in order to achieve high frequency dithering of the capacitors (which lowers the impact of dithering noise) and consistent time alignment between the phase of the oscillator and the switching activity on any given varactor control signal.

Figure 5:
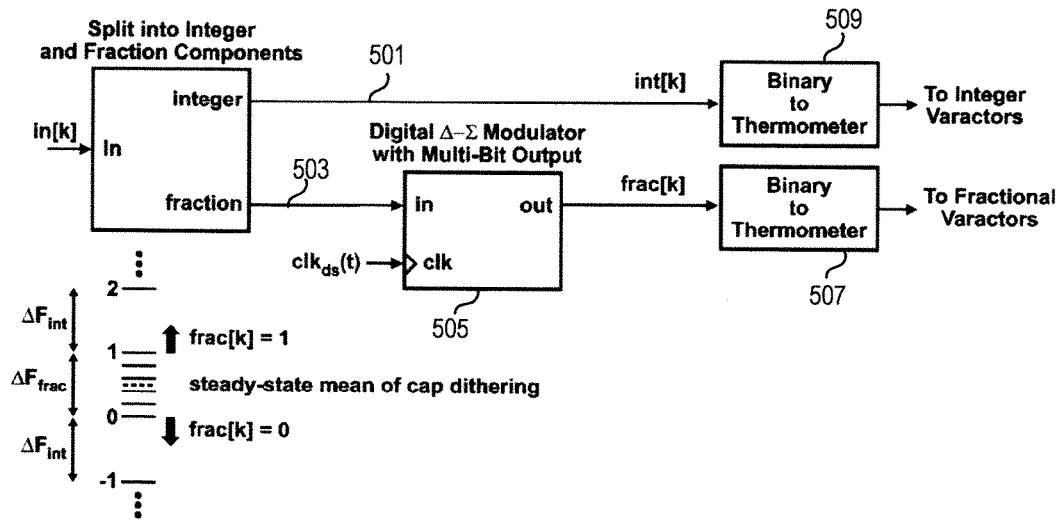
FIG. 5 is a simplified view of digital control path implementation when utilizing integer and fractional varactors.

FIG. 5 shows an example implementation of the control circuitry for the integer and fractional varactors. First the digital control path signal, in[k], is separated into an integer component 501 and a fractional component 503. The fractional component 503 is fed into a multi-bit Δ-Σ modulator 505 whose output feeds into a binary-to-thermometer converter 507 that provides the individual varactor control signals. Note that, in general, the binary-to-thermometer output should be re-timed with a set of registers clocked by $clk_{ds}(t)$ in order to avoid glitching in the varactor control signals. A binary-to-thermometer converter 509 is also used for the integer path, but glitches and other non-idealities are not of as much concern in this case since the integer varactor binary control values will be constant under steady-state conditions. If a higher order multi-bit delta sigma modulator is used, a dynamic element matching (DEM) circuit may also want to be included for the multi-bit fractional capacitor dithering in order to shape the mismatch of the fractional capacitor values. For a first order multi-bit delta sigma modulator, a DEM would generally be unnecessary since the first order multi-bit delta sigma modulator will only toggle one capacitor at a time.

Figure 6:
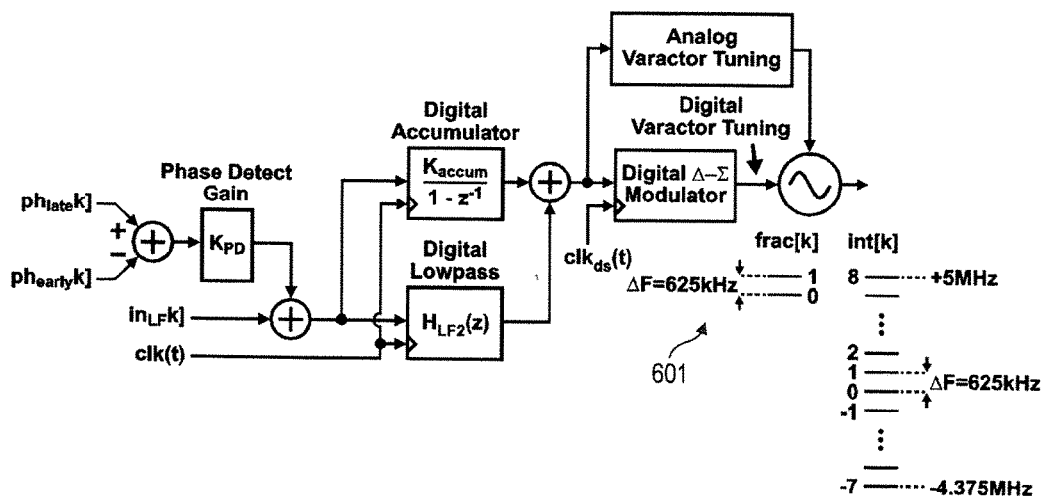
FIG. 6 illustrates segmentation of digital control path varactors into integer and fractional sections for the case where only one fractional varactor is utilized.
Figure 7:
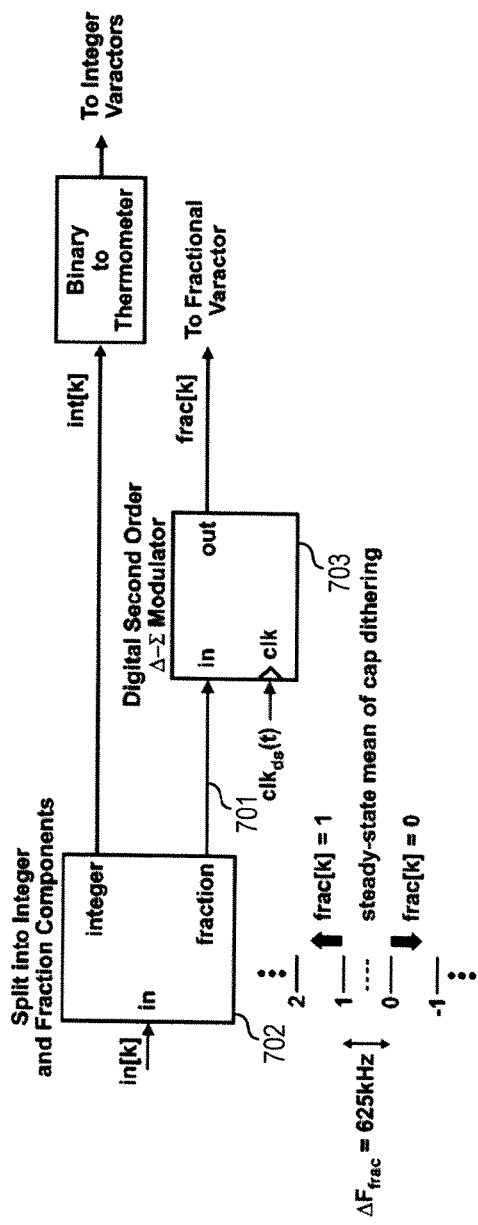
FIG. 7 is a simplified view of digital control path implementation in which only one fractional varactor is required.

In some applications, such as unmodulated frequency synthesizers and low noise clock generators, the steady-state range required of the digital control path is adequately small such that only one fractional varactor 601 is required as shown in FIG. 6. An issue of concern in such case is the potential generation of spurious noise from the digital delta sigma (Δ-Σ) modulator since the input signal may have insufficient activity to provide significant scrambling of the Δ-Σ quantization noise. In this case, a first order Δ-Σ modulator should likely be avoided in favor of a higher order design such as a 1-bit output second order Δ-Σ modulator. As indicated by FIG. 7, an advantage of using only one fractional cap is that the binary-to-thermometer converter for the fractional varactor is no longer needed. Additionally, no dynamic element matching (DEM) is required. FIG. 7 shows saturation of the fractional signal (frac[k]=1 or frac[k]=0) when the range of the fractional varactor is exceeded. In the case of saturation behavior as shown in FIG. 7, the delta-sigma modulator input 701 only takes on the fractional value when the integer value is between 0 and 1, and otherwise the input is saturated at 0 or 1 by splitting logic 702. Note that while FIG. 7 illustrates one possible way to control the fractional capacitors, the fractional capacitors can be controlled in different ways. For example, another embodiment allows the fractional varactor to remain dithered across the full range of the integer varactors, in which case the delta-sigma modulator 703 is fed by the fractional error signal regardless of the integer value.

Figure 8:
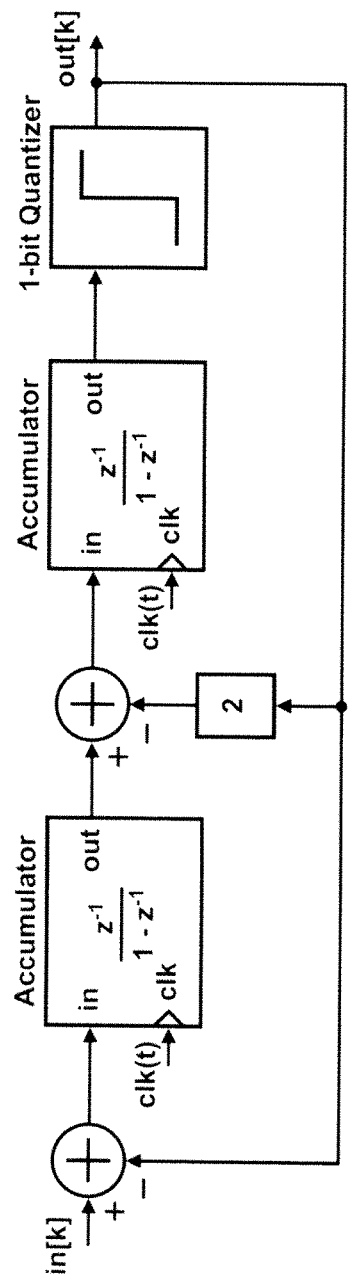
FIG. 8 is a block diagram of a digital second order 1-bit Delta Sigma ($\Delta$-$\Sigma$) modulator that is useful in embodiments described herein.

FIG. 8 depicts an example digital second order Δ-Σ modulator, which is a conventional feedback structure that offers unconditional stability across its full range. While it is especially useful as the Δ-Σ modulator for the digital control path when only one fractional capacitor is utilized, it is also a convenient structure for use in the analog control path as will be discussed later herein.

Figure 9:
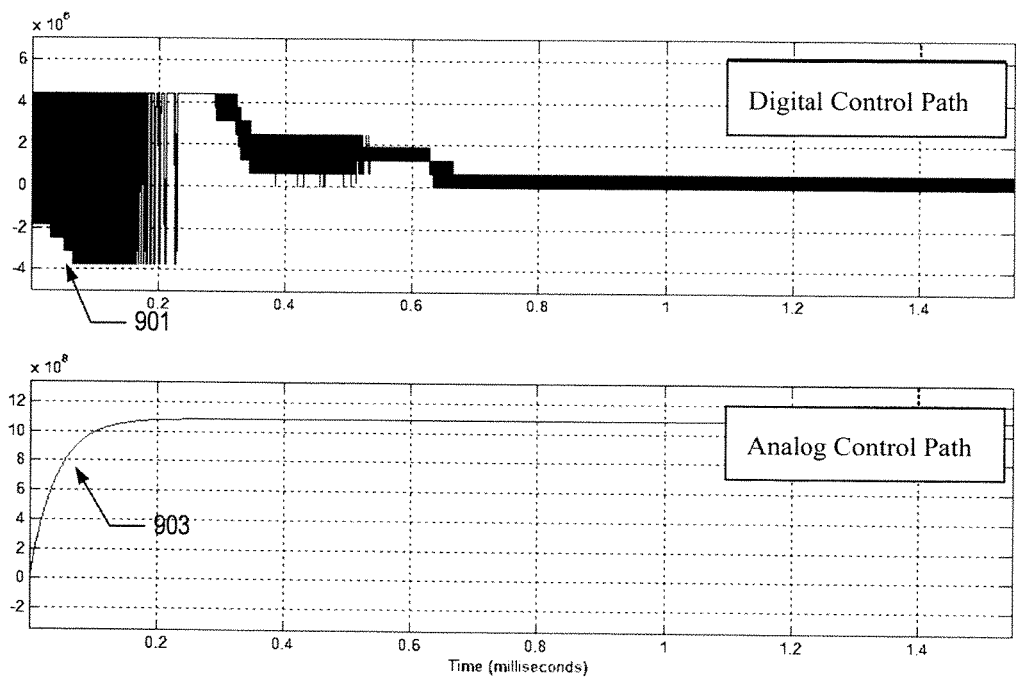
FIG. 9 is a behavioral simulation of digital and analog control path signals during settling of a PLL having only one fractional varactor.

To illustrate the dynamic behavior of the PLL using the proposed hybrid implementation approach for achieving digital control of the oscillator, FIG. 9 shows behavioral simulation results of the digital and analog path control values as the PLL settles in frequency for the example depicted in FIGS. 6 and 7. As seen in FIG. 9, saturation occurs in the digital control path during the initial part 901 of the transient due to its limited frequency range (which is set by the integer capacitors within the digital control path). In contrast, the analog control path steadily adjusts in value (903) until the PLL achieves phase/frequency lock. As the PLL enters phase/frequency lock conditions, the integer capacitors move away from their saturation state as shown in the figure. Note that the number of integer capacitors that are dithered is a function of the amount of cancellation of divider dithering noise that is achieved. For the simulation results shown in FIG. 9, cancellation of such noise begins at 500 μs and quickly reduces the number of integer capacitors that are dithered. The figure also reveals that the offset of the digital control path is adjusted in a nonlinear manner due to the nonlinearity of the analog tuning path (to be discussed soon). However, once the offset is low enough to avoid dithering of integer capacitors, such nonlinearity is not of significant concern since the digital control path still has dominant control over the PLL dynamics even when it is not centered.

Figure 10:
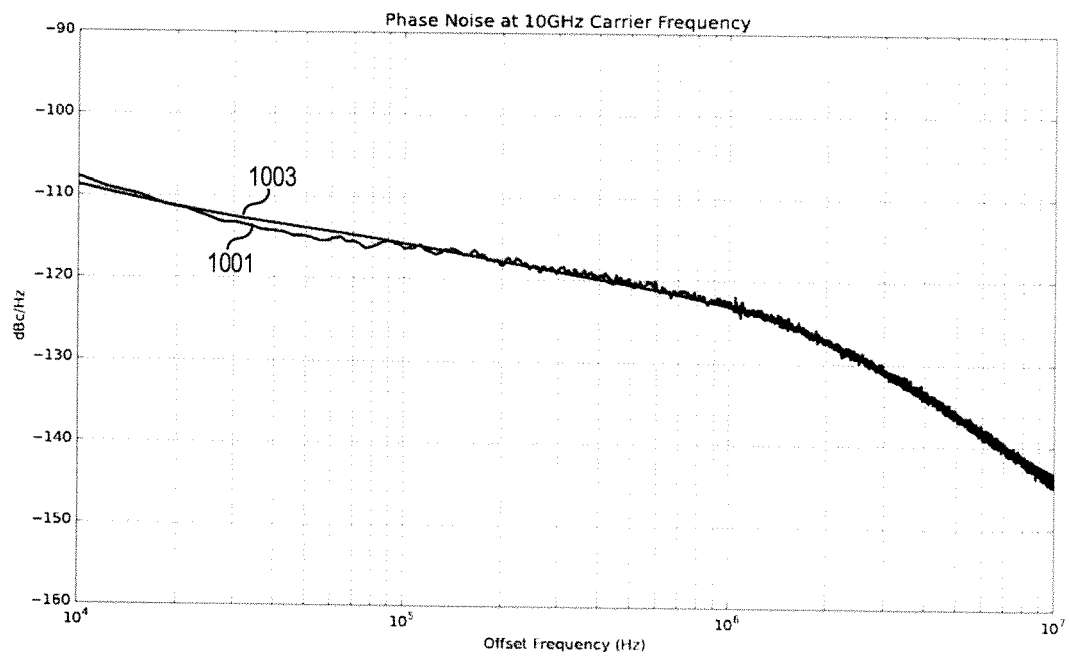
FIG. 10 is a behavioral simulation of PLL phase noise showing that implementation of the hybrid oscillator control approach does not degrade performance compared to the predicted phase noise performance plot that has less than 100 fs integrated jitter.

FIG. 10 shows the simulated phase noise of the digital PLL whose settling behavior was shown in FIG. 9. Here we see very close agreement between the simulated phase noise 1001 and predicted phase noise performance 1003 of less than 100 fs integrated jitter, which demonstrates that the hybrid control approach is viable for high performance PLL applications.

Analog Control Path Implementation

Figure 11:
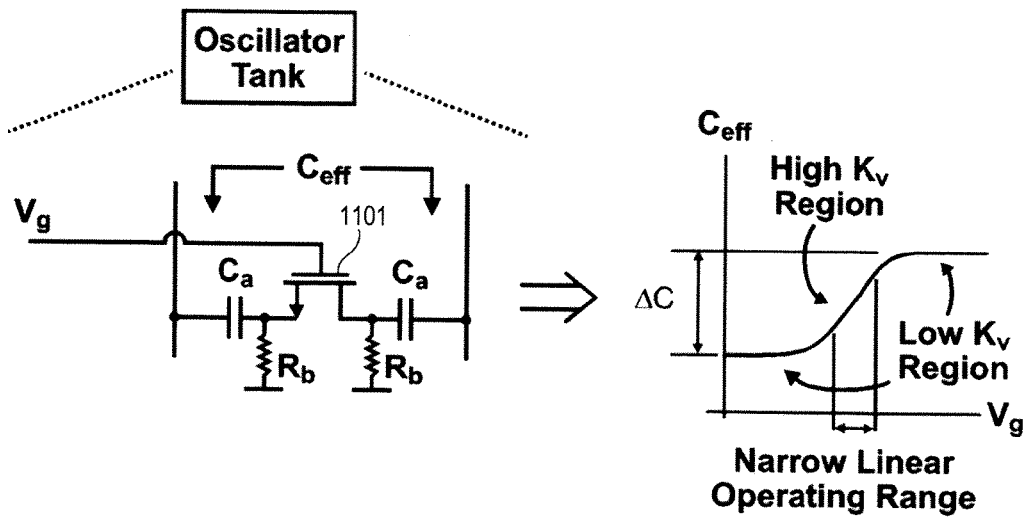
FIG. 11 illustrates an example varactor cell and its nonlinear voltage-to-capacitance characteristic.

To explain the proposed analog varactor control method, we begin by showing a simplified view of an example varactor cell as shown in FIG. 11. Here the gate voltage Vg (i.e., control voltage) of a CMOS transistor 1101 is adjusted to create a nonlinear change in capacitance that saturates at high and low values as illustrated in FIG. 11. In contrast to binary signaling of the varactor control voltage as used by the digital control path, the analog control path allows the control voltage to take on any value between the supply voltage and ground. Therefore, while the digital control path achieves good average linearity through dithering of the binary control signal of a given varactor, the analog control path experiences significantly nonlinearity due to its exposure to the nonlinear voltage-to-capacitance characteristic of the varactor. As indicated in FIG. 11, the high and low slope regions of the voltage-to-capacitance characteristic of the varactor are referred to as high and low $K_v$ regions, respectively. Note that both analog and digital varactors are typically controlled with regulated voltages rather than the chip supply voltage in order to reduce noise and perturbations coming from the chip supply voltage.

Figure 12:
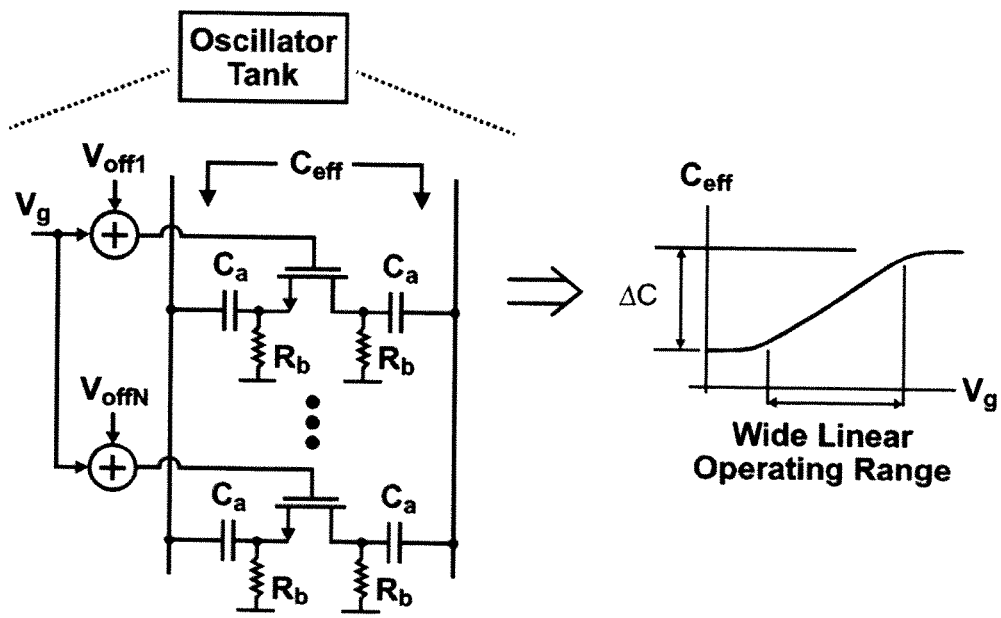
FIG. 12 is an improvement of voltage-to-frequency linearity by using an expander circuit to control multiple analog varactors.

The influence of nonlinearity in the analog tuning path can be reduced by utilizing multiple varactors whose control voltages are offset from each other as shown in FIG. 12. We refer to the circuit that creates the offset voltages from a master control signal (i.e., signal $V_g$ in FIG. 12) as an expander circuit. The master control signal, in turn, is generated by a Digital-to-Analog Converter (DAC) circuit when pursuing a digitally controlled oscillator. As indicated in FIG. 12, utilization of the expander circuit provides a relatively wide linear operating range of the DAC-controlled capacitance characteristic. While there are a number of ways to implement an expander circuit, it typically carries the cost of introducing extra power, area, noise, and analog complexity.

Figure 13:
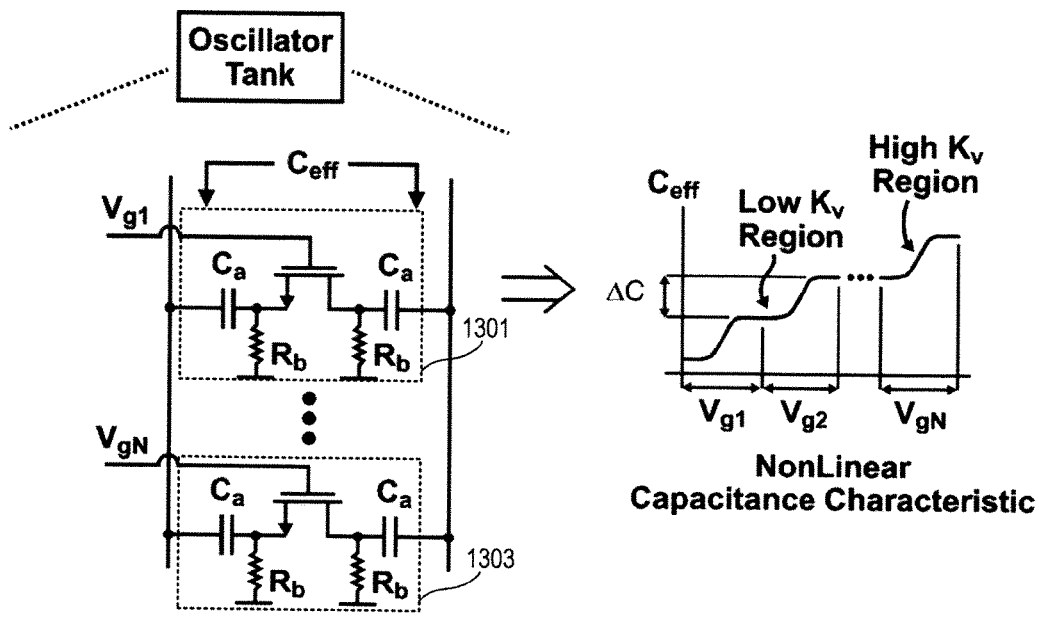
FIG. 13 illustrates the use of multiple analog varactors in which no expander circuit is used such that only one varactor is actively adjusted at a given time.

In examining the issue of noise, a key observation is that its influence is highest when the varactor is biased in the high $K_v$ region of its voltage-to-capacitance characteristic. In general, key noise sources of concern include the quantization and thermal noise of the DAC circuit that controls the varactor, and the degradation of Q in the oscillator tank due to the resistance of the varactor switch. The influence of such noise on the overall PLL phase noise can be reduced by increasing the number of varactor cells and ensuring that only a small subset are active in their high $K_v$ region at any given time. To that end, FIG. 13 depicts control of a number of varactors 1301, 1303 such that the expander circuit is removed and only one varactor is active at a given time controlled by $V_{g1}, \ldots, V_{gN}$. The benefit of activating only one varactor at a time is that it minimizes the influence of noise and analog complexity, but the drawback is significant nonlinearity in the DAC-controlled capacitor characteristic.

Figure 14:
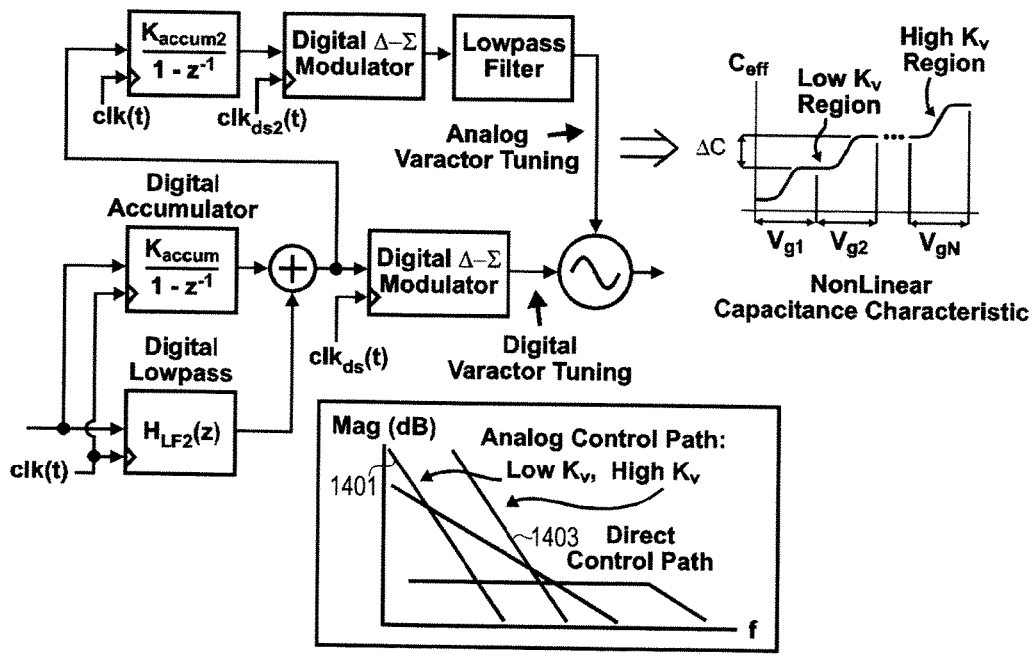
FIG. 14 illustrates utilization of the analog control path to provide centering of the digital control path such that the frequency response of the analog control path is confined to relatively low frequencies relative to the digital control path.

FIG. 14 shows the proposed approach of accommodating the nonlinearity of the DAC-controlled capacitance characteristic shown in FIG. 13, which is to utilize it within an analog control path that provides relatively low bandwidth centering of the digital control path. As mentioned earlier, the digital control path achieves high linearity by using a Δ-Σ modulator to dither the varactor control voltages between high and low values. By designing the frequency response of the analog tuning path to be sufficiently lower than that of the digital control path, the overall PLL bandwidth, stability, and noise performance are primarily controlled by the digital control path. FIG. 14 shows the low Kv frequency response 1401 and the high Kv frequency response 1403 as well as the digital control path. Since the digital control path is continually centered, it needs only to have enough range to respond to perturbations that are too fast to be tracked by the analog tuning path and can therefore be implemented with a relatively small number of capacitors. The analog tuning path, in turn, provides the wide adjustment range of the oscillator frequency needed to achieve the desired PLL frequency range under PVT variations, and its nonlinearity is not of significant concern due to the dominance of the digital control path in setting the PLL dynamics and noise performance.

Figure 15:
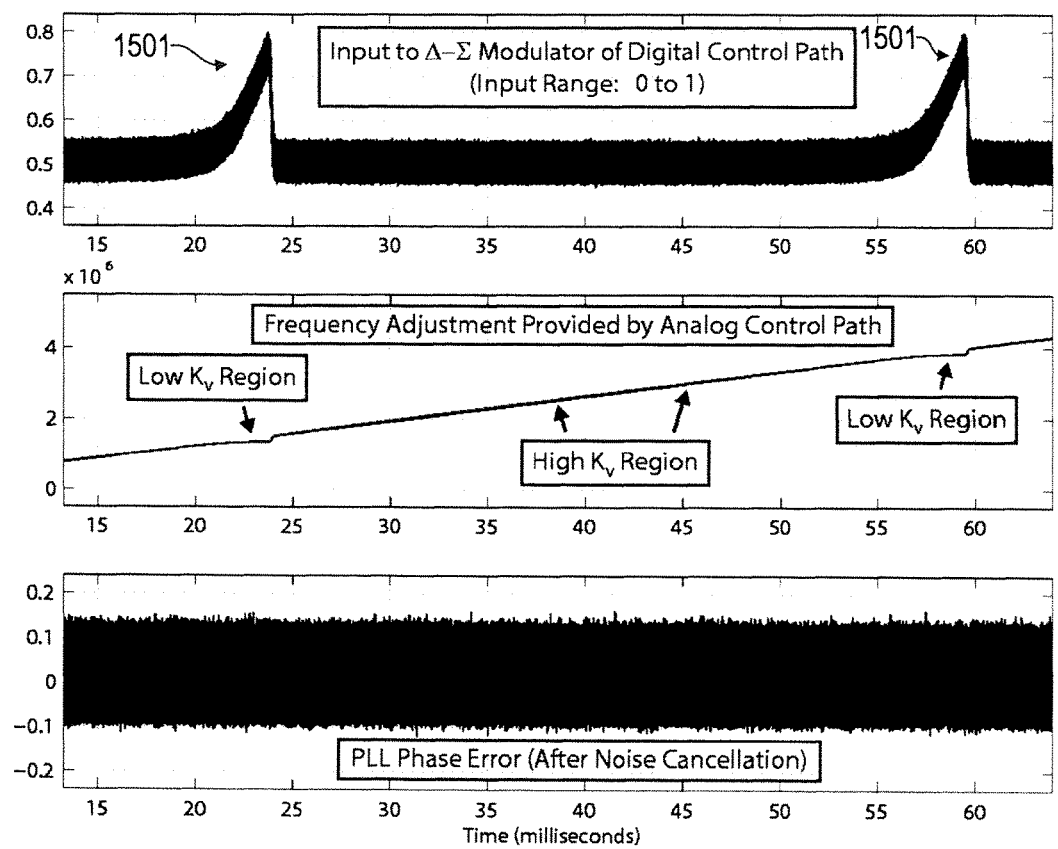
FIG. 15 is a simulation of a digital PLL with hybrid control of its oscillator under a 100° C./second ramp in temperature assuming 70 ppm/° C. sensitivity of the oscillator.

To better understand the nonlinear dynamics that occur in the proposed hybrid control implementation, FIG. 15 shows behavioral simulation results of the analog and digital control paths when a temperature ramp of 100° C./second is applied. In this simulation, the oscillator temperature sensitivity is assumed to be −70 ppm/° C., so that the analog control path must ramp its output to counter the effects of the temperature ramp. However, as shown in FIG. 13, the frequency tuning performed by the analog control path effectively flattens when it enters a low $K_v$ region of the given varactor it is controlling. In such case, the fractional portion of the digital control path, normally at 0.5 relative to a range of 0 to 1, must ramp its value to compensate for the effects of the temperature range. The increased digital control value at 1501 causes a faster ramp of the varactor control voltage in the analog path so that the time spent in the low $K_v$ region is reduced. As the varactor control voltage in the analog path approaches a high $K_v$ region, the digital control value quickly drops back towards its centered value. This process repeats for each analog path varactor for the duration of the temperature ramp. As shown in FIG. 15, the digital control range can be easily designed to have sufficient range to handle such perturbations so that the overall PLL phase error remains well controlled as shown in the bottom sub-plot of FIG. 15.

Figure 16:
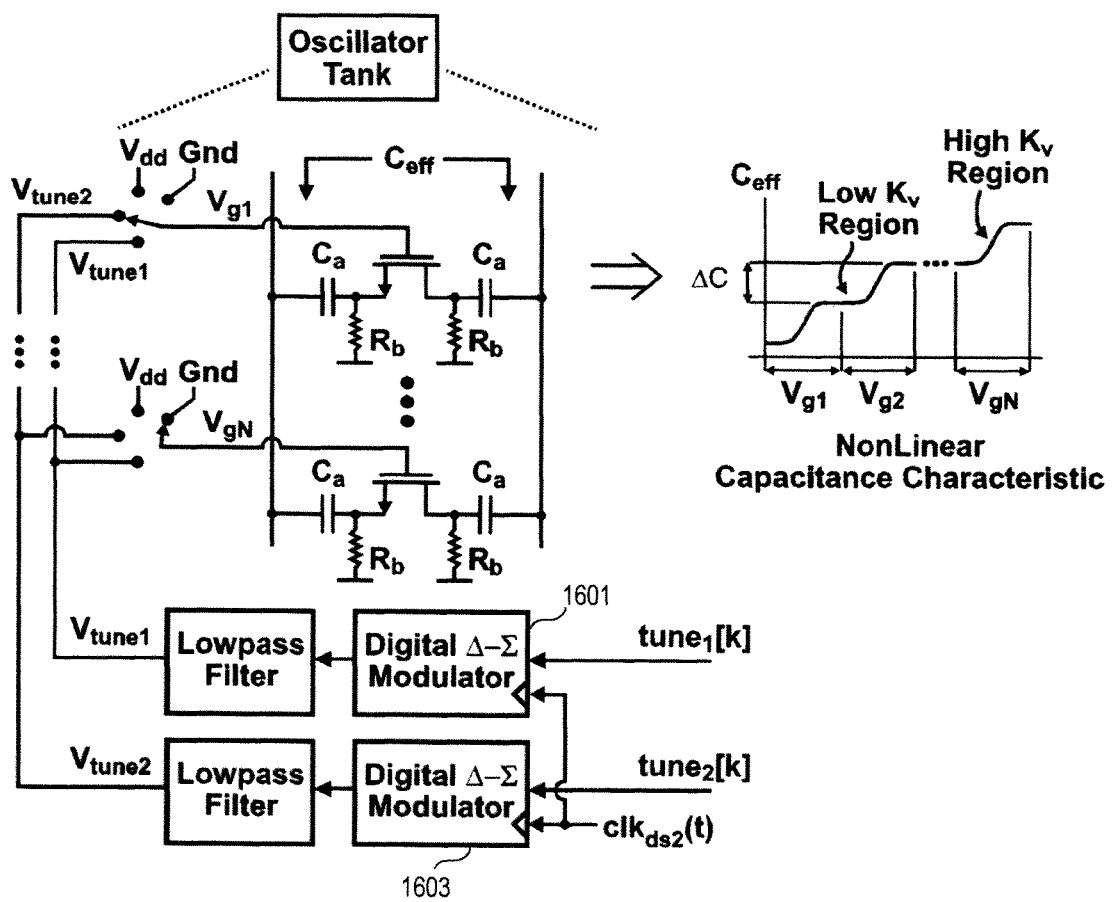
FIG. 16 shows an embodiment of the analog path with four possible switch states for each varactor using two digital-to-analog converters (DACs) and low pass filter networks that are operated in ping-pong fashion.

FIG. 16 illustrates an exemplary analog control path implementation in which each varactor control signal $V_{g1}, \ldots, V_{gN}$, is switched between one of four possible states. Varactors that are not currently active have their control signal set to either Gnd or $V_{dd}$ as appropriate. Note that $V_{dd}$ may be a regulated supply voltage rather than the chip supply voltage. The single active varactor has its control signal attached to either Vtune$_1$ or Vtune$_2$, which are the outputs of two DACs 1601 or 1603 after they have been low pass filtered. The choice of Vtune$_1$ or Vtune$_2$ is chosen in ping-pong fashion. If Vtune$_1$ was used for the previous varactor that was active, then Vtune$_2$ is used for the current varactor that is active. Conversely, if Vtune$_2$ was used for the previous varactor that was active, then Vtune$_1$ is used for the current varactor that is active.

Figure 17:
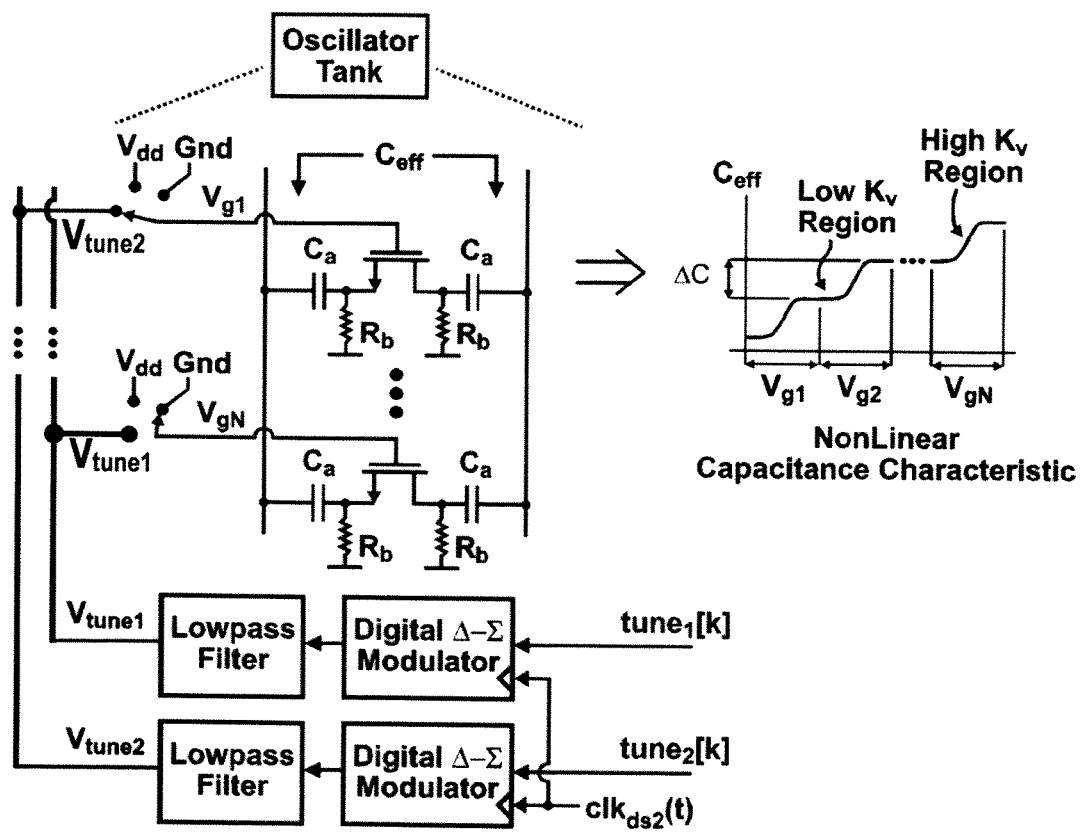
FIG. 17 shows an embodiment of the analog path with three possible switch states for each varactor using two DACs and low pass filter networks that are operated in ping-pong fashion.

FIG. 17 illustrates an embodiment in which the analog control path is simplified from the embodiment shown in FIG. 16 in that each varactor control signal is switched between one of three possible states rather than four possible states. Varactors that are not currently active have their control signal set to either Gnd or $V_{dd}$ as appropriate. The single active varactor has its control signal attached to a digital-to-analog converter (DAC) controlled signal that is either Vtune$_1$ or Vtune$_2$. In an embodiment Vtune$_1$ or Vtune$_2$ are respectively coupled to odd and even varactors. Thus, if Vtune$_1$ was used for the previous odd varactor that was active, then Vtune$_2$ is used for the current even varactor that is active. Conversely, if Vtune$_2$ was used for the previous even varactor that was active, then Vtune$_1$ is used for the current odd varactor that is active.

Figure 18:
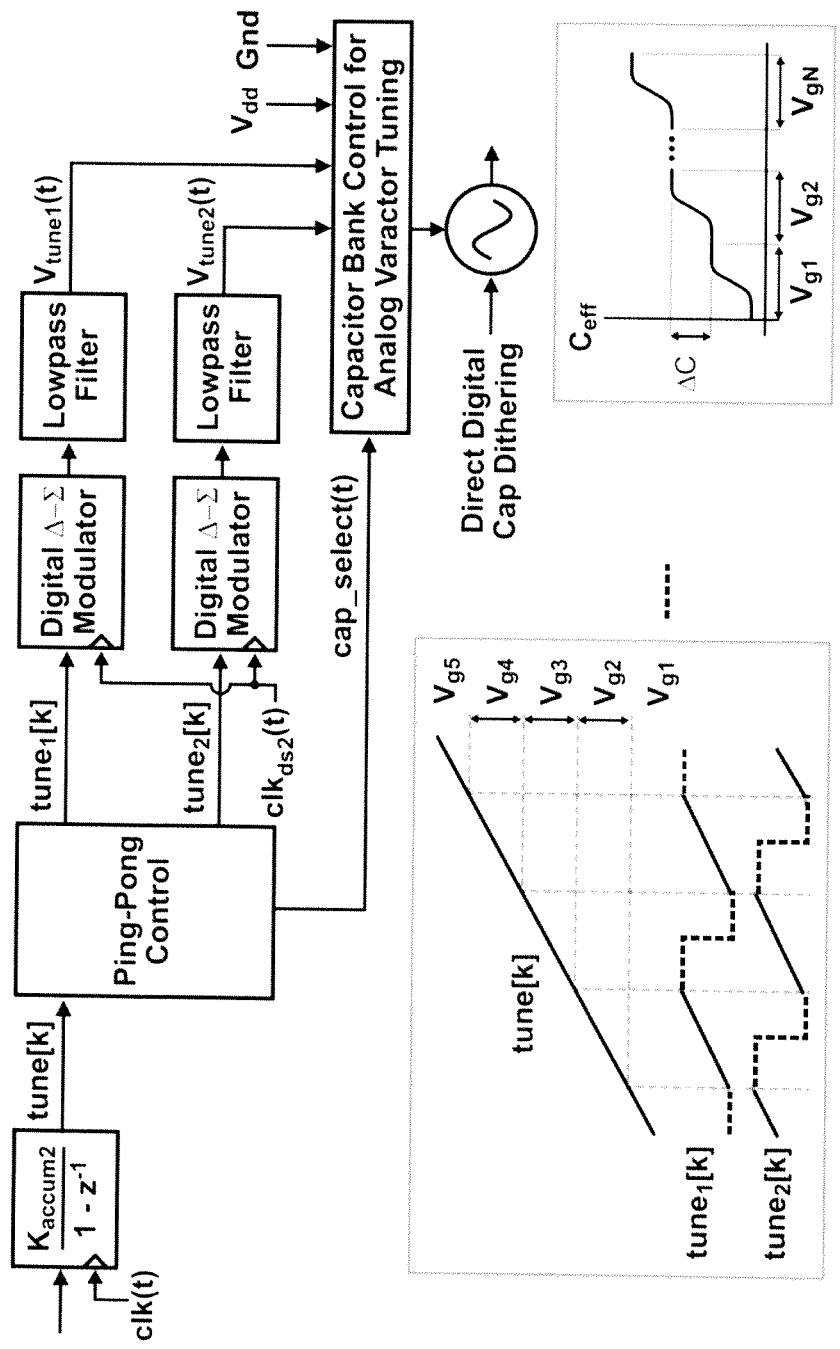
FIG. 18 illustrates tuning waveforms within the analog control path when the oscillator is ramped in frequency, which illustrate the ping-pong nature of the individual DAC control signals, $tune_1[k]$ and $tune_2[k]$.

To illustrate the ping-pong control action, FIG. 18 shows the DAC input signals, tune$_1$[k] and tune$_2$[k], that occur when the analog control path is ramped in time. The dotted portions of tune$_1$[k] and tune$_2$[k] represent the case where the given DAC signal has no impact on a varactor since the active varactor is connected to the low pass filter of the other DAC. Here we see that the ping-pong action allows a discontinuous switch in the DAC input value without impact to the oscillator, as seen in the negative step waveforms in tune$_1$[k] and tune$_2$[k]. As such, a continuous ramp in the oscillator frequency can be achieved across a number of analog varactor cells without adverse impact on the PLL phase noise performance. Note that while FIG. 18 shows a simple case of placing the discontinuous switching event in the middle of the range of the other DAC input value that is active, it is often preferable to utilize hysteresis in controlling the discontinuous switching event so as to avoid unnecessary glitching behavior as the tuning voltage wanders due to noise and other perturbations.

Figure 19:
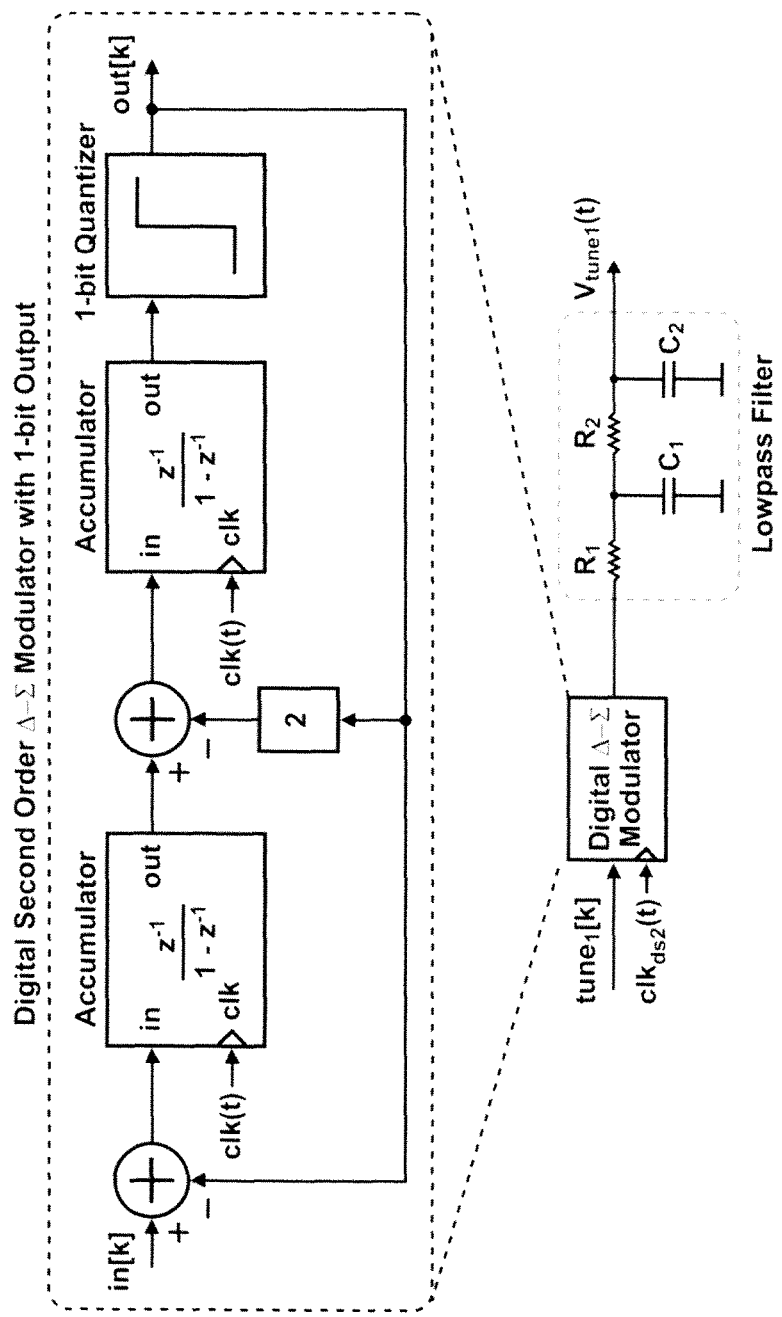
FIG. 19 shows an embodiment of analog control path DAC using a digital second order $\Delta$-$\Sigma$ modulator with 1-bit output and a second order RC filter.

An embodiment of the DAC and low pass filter used in the analog control path is shown in FIG. 19. A digital second order Δ-Σ modulator with 1-bit output is utilized in similar fashion to the digital control path. The output of the Δ-Σ modulator is fed into a second order RC filter to significantly attenuate its shaped quantization noise. In other embodiments other filters could be used, particularly more RC sections than just two. A key observation for the analog control path is that the DAC input is not typically centered as is the case for the digital path. As such, the DAC must operate and therefore be stable over its entire range. While the digital second order Δ-Σ modulator structure shown in FIG. 19 offers such full range stability, the noise shaping ability of the structure will be impacted at the extreme ends of its range. Fortunately, the presence of the RC low pass filter will still significantly attenuate such noise. Further, at the extreme ends of the DAC range, the varactor will be operating in a low $K_v$ region such that the impact of the quantization noise is significantly reduced compared to operating in the high $K_v$ region. As such, the nonlinear voltage-to-frequency characteristic of the varactor is actually of benefit in this design to allow full range operation of the DAC while still achieving excellent noise performance. An embodiment utilizes a return-to-zero (RZ) control of the 1-bit DAC controlled by the delta sigma modulator. Another embodiment utilizes non-return-to-zero (NRZ) control. The NRZ approach may generate more intersymbol-interference (ISI) as compared to the RZ control approach.

Thus, various aspects have been described relating to use of hybrid analog and digital control of an oscillator. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A phase-locked loop comprising:

a digital control path to control a first plurality of varactors within a tank circuit of an oscillator; and an analog control path to control a second plurality of varactors within the tank circuit to control frequency of the oscillator.

2. The phase-locked loop as recited in claim 1 wherein the analog control path acts to reduce a range required of the digital control path.

3. The phase-locked loop as recited in claim 1 wherein a frequency response of the analog control path intersects a digital control path frequency response at a frequency close to or lower than a zero contained in the digital control path frequency response.

4. The phase-locked loop (PLL) as recited in claim 1 wherein a bandwidth of the analog control path is below a bandwidth of the PLL such that the analog control path has a non-dominant effect on the bandwidth and stability performance of the PLL.

5. The phase locked loop as recited in claim 1 further comprising a delta sigma modulator in the digital control path, an output of the delta sigma modulator coupled to control one or more of the first plurality of varactors.

6. The phase locked loop as recited in claim 1 wherein control signaling in the digital control path for the first plurality of varactors is binary and for the analog control path respective analog control signals for the second plurality of varactors are coupled to a first voltage, a second voltage, or a tuning voltage with a range spanning the first and second voltages.

7. The phase locked loop as recited in claim 1 wherein the analog control path has only one of the second plurality of varactors being actively tuned at a time and respective control signals for remaining ones of the second plurality of varactors are set to a first or second voltage while the one of the second plurality of varactors that is being actively tuned has its control signal set to a tuning voltage with a range spanning the first and second voltages.

8. The phase locked loop as recited in claim 1 wherein the analog control path includes a delta sigma modulator coupled to a low pass filter to supply an analog varactor control signal for an active varactor.

9. The phase locked loop as recited in claim 8 wherein the delta sigma modulator is a digital second order delta sigma modulator and the low pass filter is an RC filter.

10. The phase locked loop as recited in claim 1,
wherein the digital control path includes a digital filter coupled to receive a phase error signal; and
wherein the analog control path includes,
a summing circuit coupled to receive a frequency error signal and coupled to receive an output of the digital control path;
an accumulator circuit coupled to accumulate an output of the summing circuit;
a delta sigma modulator coupled to the accumulator circuit; and
a low pass filter coupled to an output of the delta sigma modulator to supply an analog varactor tuning signal to control one or more of the second plurality of varactors.

11. The phase locked loop as recited in claim 10 wherein the digital filter comprises:
a feedforward path;
an accumulator path including a second accumulator circuit; and
a second summing circuit coupled to sum an output of the second accumulator circuit and an output of the feedforward path, an output of the second summing circuit being supplied to the summing circuit of the analog control path; and
wherein the digital control path includes a second delta sigma modulator coupled to receive the second summing circuit output and to control one or more of the first plurality of varactors.

12. A method of operating a phase-locked loop comprising:
controlling a first plurality of varactors within a tank circuit of an oscillator of the phased-locked loop using a digital control path; and
controlling a second plurality of varactors within the tank circuit of the oscillator using an analog control path.

13. The method as recited in claim 12 further comprising the analog control path centering the digital control path in a desired input range of the digital control path.

14. The method as recited in claim 12 further comprising operating the analog control path with a bandwidth such that the analog control path creates a zero in a phase-locked loop (PLL) transfer function that occurs at a frequency less than one third of an overall PLL bandwidth.

15. The method as recited in claim 12 further comprising controlling one or more of the first plurality of varactors with a delta sigma modulator in the digital control path.

16. The method as recited in claim 12 further comprising:
utilizing binary control signaling for the digital control path; and
coupling respective analog control signals for the second plurality of varactors to a first voltage, a second voltage, or a tuning voltage with a range spanning the first and second voltages for the analog control path.

17. The method as recited in claim 12 further comprising activating only one of the second plurality of varactors at a time by controlling the activated one of the second plurality of varactors with a tuning voltage.

18. The method as recited in claim 12 further comprising generating an analog control signal in the analog control path using a delta sigma modulator and a low pass filter to supply an analog varactor control signal to an active varactor of the second plurality of varactors.

19. The method as recited in claim 12 further comprising:
in the digital control path accumulating a phase error signal and generating an accumulator output;
summing the accumulator output and a feed forward path output to generate a first sum;
supplying the first sum to a first delta sigma modulator;
supplying an output of the first delta sigma modulator as a dithered control signal for at least one varactor of the first plurality of varactors;
in the analog control path accumulating the first sum in a second accumulator;
supplying an output of the second accumulator to a second delta sigma modulator; and
low pass filtering an output of the second delta sigma modulator to generate an analog varactor tuning signal for an active varactor.

20. A phase-locked loop comprising:
a digital control path coupled to receive a phase error signal and to control a first plurality of varactors within a tank circuit of an oscillator, the digital control path including a digital filter; and
an analog control path configured to control a second plurality of varactors within the tank circuit, the analog control path coupled to receive an output of the digital control path and to generate analog control signals for the second plurality of varactors.

\* \* \* \* \*